United States Patent
Nakata

[11] Patent Number: 6,153,007
[45] Date of Patent: Nov. 28, 2000

[54] METHOD OF MANUFACTURING A SINGLE CRYSTAL AND APPARATUS FOR MANUFACTURING SINGLE CRYSTAL

[76] Inventor: Josuke Nakata, 112-17, Kamiootani, Kuse, Jyoyo-shi, Kyoto 610-01, Japan

[21] Appl. No.: 09/331,502
[22] PCT Filed: Oct. 23, 1997
[86] PCT No.: PCT/JP97/03844
§ 371 Date: Jun. 22, 1999
§ 102(e) Date: Jun. 22, 1999
[87] PCT Pub. No.: WO99/22048
PCT Pub. Date: Jun. 5, 1999
[51] Int. Cl.[7] .................................................. C30B 25/02
[52] U.S. Cl. ............................... 117/11; 117/32; 117/204; 117/206; 117/903
[58] Field of Search .................................. 117/30, 32, 34, 117/35, 81, 83, 204, 206, 903

[56] References Cited

U.S. PATENT DOCUMENTS 4,021,323  5/1977  Kilby et al. ............................. 204/129

FOREIGN PATENT DOCUMENTS 63-50388  3/1988  Japan .
2-185975  7/1990  Japan .
3-69587  3/1991  Japan .

*Primary Examiner*—Felisa C. Hiteshew
*Attorney, Agent, or Firm*—Morrison Law Firm

[57] ABSTRACT

The present invention relates to a manufacturing method for a monocrystal and to a monocrystal manufacturing device. The present invention relates to a technology for manufacturing a granular monocrystal, wherein: melt of melted raw material is made into a supercooled spherical melt; while the melt is levitated under microgravitational conditions, the free energy of a portion of the surface of the melt is reduced, and a monocrystal is grown. A monocrystal manufacturing device 31 comprises: a gold image furnace 35, a chamber 33, a raw material supply/retention mechanism 38; a drop tube 36 and a drop tube 37; a rotating plate 39; a recovery vat 40; and the like. Raw material 32a of semiconductor material is heated and melted and allowed to free fall in a vacuum inside drop tubes 36, 37. During the drop, rotating plate 39 comes into contact with a portion of the surface of supercooled spherical melt 32b, and a crystal nucleus is generated. From this crystal, a monocrystal is grown, and a spherical monocrystal 32c is formed, and this is recovered in recovery vat 40.

20 Claims, 6 Drawing Sheets

(a)

(b)

(c)

(d)

(e)

METHOD OF MANUFACTURING A SINGLE CRYSTAL AND APPARATUS FOR MANUFACTURING SINGLE CRYSTAL

BACKGROUND OF THE INVENTION

This invention relates to a method and device for directly crystallizing a monocrystal without using a seed crystal. This is achieved by first supercooling a melt of molten raw material which is floating under microgravitational conditions, then generating a crystal nucleus, and solidifying the melt. This invention relates to an art which is particularly suitable for the manufacture of granular monocrystals of single element semiconductors and granular monocrystals of compound semiconductors.

Single element semiconductor crystals, such as silicon or germanium or the like, two-element compound semiconductor crystals, such as GaAs, GaP, GaSb, InAs, InP, InSb, ZnSe, CdTe, or the like, or mixed crystals in which 2 two-element compound semiconductors are mixed have been used as materials for electronics devices. The quality of these semiconductor crystals has a large effect on device performance. As a result, the art of manufacturing high quality bulk monocrystal (monocrystal), having few crystal defects and having a controlled composition ratio of the component elements and impurity concentration distribution, is extremely important.

If monocrystals can be manufactured by directly synthesizing a chemical compound melt from the semiconductor raw material and directly solidifying this melt without using seed crystals, the performance of the electronics device can be improved. This is also preferable in terms of the manufacturing cost. Presently, known methods in which large bulk monocrystals are grown by solidifying melt of semiconductor raw material include CZ method, FZ method, Bridgeman method, and the like.

However, with all of these methods, the monocrystal is grown from a seed crystal, and as a result, a good quality seed crystal must be prepared first. Generally, the method which is adopted is a method in which the seed crystal is cut from a large monocrystal which is manufactured separately. However, depending on the type of semiconductor, it can be difficult to manufacture a good quality monocrystal. In these cases, a sintered body or a precious metal rod is used as a seed, and a polycrystal is grown. A monocrystal portion with a comparatively large grain is cut from this polycrystal and made into the seed crystal. However, it is difficult to obtain a good quality seed crystal.

In the method for growing crystals from a melt of the prior art, complex fluid motion is generated within the melt due to the influence of gravity, and it is known that this can have a large effect on the quality of the growing crystal. As its most important drawback, a crucible for storing the melt is needed. A reduction in the purity of the crystal or defects in the crystal are generated because of the chemical physical actions of the crucible. Thermal convection is generated when there are temperature differences within the melt. Because of the resulting fluctuation in the temperature and composition at the solid/liquid interface, crystal defects are readily generated, and quality is unstable. This results in a crystal with non-uniform composition and many crystal defects.

In order to eliminate the negative effect of gravity, various experiments have been conducted on growing crystals under microgravitational conditions which are achieved in space stations, space shuttles, rockets, and aircrafts. However, the costs for crystal manufacture becomes enormous, and the materials which can be used become limited. In addition, because of minute gravitational disturbances called G jitters, shaking is generating during the crystal growth period. This is not ideal. Recently, a free-fall facility located on the ground has achieved microgravitational conditions with few G jitters, although only for the short period of time of approximately 10 seconds. There is much anticipation on its use, but methods for directly growing monocrystals from melts have not been proposed.

For example, in U.S. Pat. No. 4,021,323, there is described a technology, wherein: molten silicon droplet is shot from a small nozzle which is placed on the upper end of a shot tower; silicon melt is allowed to free fall in air from the shot tower, and granular crystals of silicon are created. However with this technology, an adequate microgravitational environment is not created due to the air resistance during the fall. In addition, impurities from the nozzle may become dissolved into the molten silicon.

The present invention is based on new facts discovered by the present inventors while conducting various experiments of creating spherical crystals from semiconductor melt under microgravitational conditions generated by a free fall facility.

OBJECTS AND SUMMARY OF THE INVENTION

The object of the present invention is the following: to provide technology for manufacturing monocrystals from melts of various semiconductor materials (single element semiconductors, a plurality of types of single element semiconductors, compound semiconductors) without using seed crystals; to provide technology for manufacturing high quality monocrystals with few crystal defects; to provide technology for manufacturing monocrystals from melts of various other materials without using seed crystals; and the like.

The present invention is a method for manufacturing monocrystals in which raw material is melted and then solidified, comprising: a first step in which a raw material is heated and melted; a second step in which the temperature of the melt of the raw material is reduced, and the melt is supercooled to a spherical melt; a third step in which, while the supercooled spherical melt is floating under microgravitational conditions, the surface free energy of a portion of the surface of the spherical melt is reduced, and a crystal nucleus is generated in the spherical melt; a fourth step in which the spherical melt with the crystal nucleus is solidified into a granular monocrystal.

While being levitated under microgravitational conditions of a gravitational acceleration of approximately $10^{-3}$ to $10^{-5}$ G, the melt, where raw material such as a semiconductor has been melted, becomes a spherical melt in which the action of surface tension maintains a free surface. While maintaining levitation, the temperature is lowered, and it is supercooled. Because it is being levitated under microgravitational conditions and without contact, there is no non-uniform nucleus generation. Because there is little variation in the temperature or density within the melt, the free energy barrier to uniform nucleus generation is high, and the degree of supercooling becomes high. A crystal nucleus is generated by lowering the surface free energy of a portion of this spherical melt which has been supercooled to a high degree. With this generation of the crystal nucleus, the supercooled spherical melt rapidly solidifies into a granular monocrystal. In order to lower the surface free energy of a portion of the surface of the spherical melt, a highly chemically stable solid, which is to become the site of nucleus generation, can contact one end of the surface of the spherical melt for a short period of time, for example. When this method was experimented with semiconductors such as germanium (Ge), gallium antimonide (GaSb), indium antimonide (InSb), or the like, it was possible to manufacture granular monocrystals which were solidified spherical melts. In this manner, various single element semiconductor materials can be used for the raw material, and various compound semiconductor materials can also be used. When the raw material is a multi-element semiconductor compound which has a composition of 3 elements or greater, the raw material can be a polycrystal which has the stoichiometric composition of the compound, or the raw material can comprise the semiconductor material which already has each of the component elements weighed and mixed in the stoichiometric composition. However, this method is not limited to monocrystals of semiconductors, and monocrystals of various metal materials and various insulating materials can also be manufactured. It is not completely understood scientifically how it is possible to grow monocrystals with this method. When a spherical melt is under microgravitational conditions and is not in contact with other substances and becomes spherical due only to the force of surface tension and reaches a supercooled state where free energy is at a minimum, although the configuration of the spherical melt is a loose bonding between atoms, there is believed to be a regularity in the atomic alignment similar to that of a solid monocrystal. Because of this, it can be hypothesized that with the generation of a crystal nucleus, a rapid monocrystal growth is initiated.

When the raw material includes a semiconductor material with a high vapor pressure, it is preferable to conduct steps 1–4 while housing the raw materials within a capsule. In this situation, the semiconductor materials other than the semiconductor with the high vapor pressure can be housed in advance in the main compartment of the capsule; the semiconductor material with the high vapor pressure can be housed in advance in an auxiliary compartment which connects with the main compartment of the capsule; and in the first step, it is possible to heat the semiconductor material inside the main compartment and the semiconductor material inside the auxiliary compartment to different temperatures. It is preferable to conduct steps 1–4 under one of the following environments: vacuum environment, inert gas environment, oxidizing gas environment. Furthermore, by irradiating an ion beam for a short period of time at a portion of the surface of the supercooled spherical melt, surface free energy can be lowered.

By the manufacture method for monocrystals of the present invention, monocrystals can be manufactured from the melt of various single element semiconductor materials without using a seed crystal. Without using seed crystals, monocrystals of compound semiconductors can be manufactured from the melt of a plurality of types of single element semiconductor materials or from the melt of compound semiconductor materials. Monocrystals can be manufactured from the melts of various materials without using seed crystals by using a simple method which makes use of a microgravitational environment.

The present invention provides a monocrystal manufacturing device, which is suitable for use in means for achieving microgravitational conditions and which, in combination with the microgravitational conditions achieved by the microgravity achieving means, can manufacture monocrystals from raw materials. The monocrystal manufacturing device comprises: a chamber case, which forms an air-tight chamber; a raw material container, which is placed in the chamber and which stores raw materials; means for heating, which heats the raw material inside the raw material container; an actuator, which supports the raw material container onto the chamber case and which can drive movement of the raw material container with respect to the chamber case.

The raw material inside the raw material container is heated and melted by the heating means. Inside the raw material container, while being levitated without contact under microgravitational conditions, the melt is cooled to a supercooled spherical melt. While being levitated without contact under microgravitational conditions, the raw material container is moved with respect to the chamber case by the actuator. As a result, a portion of the surface of the supercooled spherical melt contacts the solid surface of the raw material container, and a crystal nucleus is generated in the spherical melt. The spherical melt is solidified, and a granular monocrystal is manufactured.

The heating means can have a construction, comprising: an ellipsoidal reflective surface; and a halogen lamp which is placed at the focal point of this ellipsoidal reflective surface. The monocrystal manufacturing device of the present invention is a monocrystal manufacturing device which can be used with a variety of means for achieving microgravitational conditions. A monocrystal manufacturing device with a simple construction is provided. Otherwise, all the same advantages as the monocrystal manufacturing method is exhibited.

According to another mode of the present invention, there is provided a monocrystal manufacturing device, which heats raw material into a melt and allows the melt to free fall and to solidify under microgravitational conditions to form a monocrystal. This monocrystal manufacturing device comprises: an air-tight drop tube, which extends vertically; means for retaining raw material, which holds the raw material at the top of the drop tube and can release the raw material; means for heating, which heats and melts the raw material which is retained by the raw material retaining means; means for generating a crystal nucleus, which generates a crystal nucleus in the spherical melt by lowering the free energy of a portion of the surface of the melt during its free fall along the drop tube after it has become supercooled while free falling inside the drop tube; a recovery part, which recovers the monocrystal which, during its free fall, has solidified into a monocrystal by using the crystal nucleus as the nucleus.

There is a suctioning means which suctions the air inside the drop tube and makes a vacuum. The spherical melt drops in a vacuum inside the drop tube. The heating means can have a construction comprising: an ellipsoidal reflective surface; and a halogen lamp located at the focal point of this ellipsoidal reflective surface. The crystal nucleus generating means can have a construction of a rotating plate of a highly chemically stable solid material which is placed in the falling pathway of the spherical melt inside the drop tube. According to this monocrystal manufacturing device, microgravitational conditions are achieved by free fall, and therefore it is possible to have the device installed on the ground. Otherwise, the same advantages as the monocrystal manufacturing method are exhibited.

According to another mode of the monocrystal manufacturing device, a capsule, which stores the raw material and which is subjected to the fall, is used. Instead of the raw material holding means, there is means for holding the capsule. The raw material is heated and melted while housed in the capsule. The melted raw material is dropped together with the capsule. In this case, because the spherical melt can not be contacted with a rotating plate of solid material during the fall, the crystal generating means is preferably a construction which includes means for deceleration which is placed in the fall pathway of the capsule inside the drop tube and which can decelerate the capsule during the fall.

According to this monocrystal manufacturing device, monocrystals of compound semiconductors which contain semiconductor materials with a high dissociation pressure can be manufactured without using seed crystals. Otherwise, the same advantages as the monocrystal manufacturing method are exhibited.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
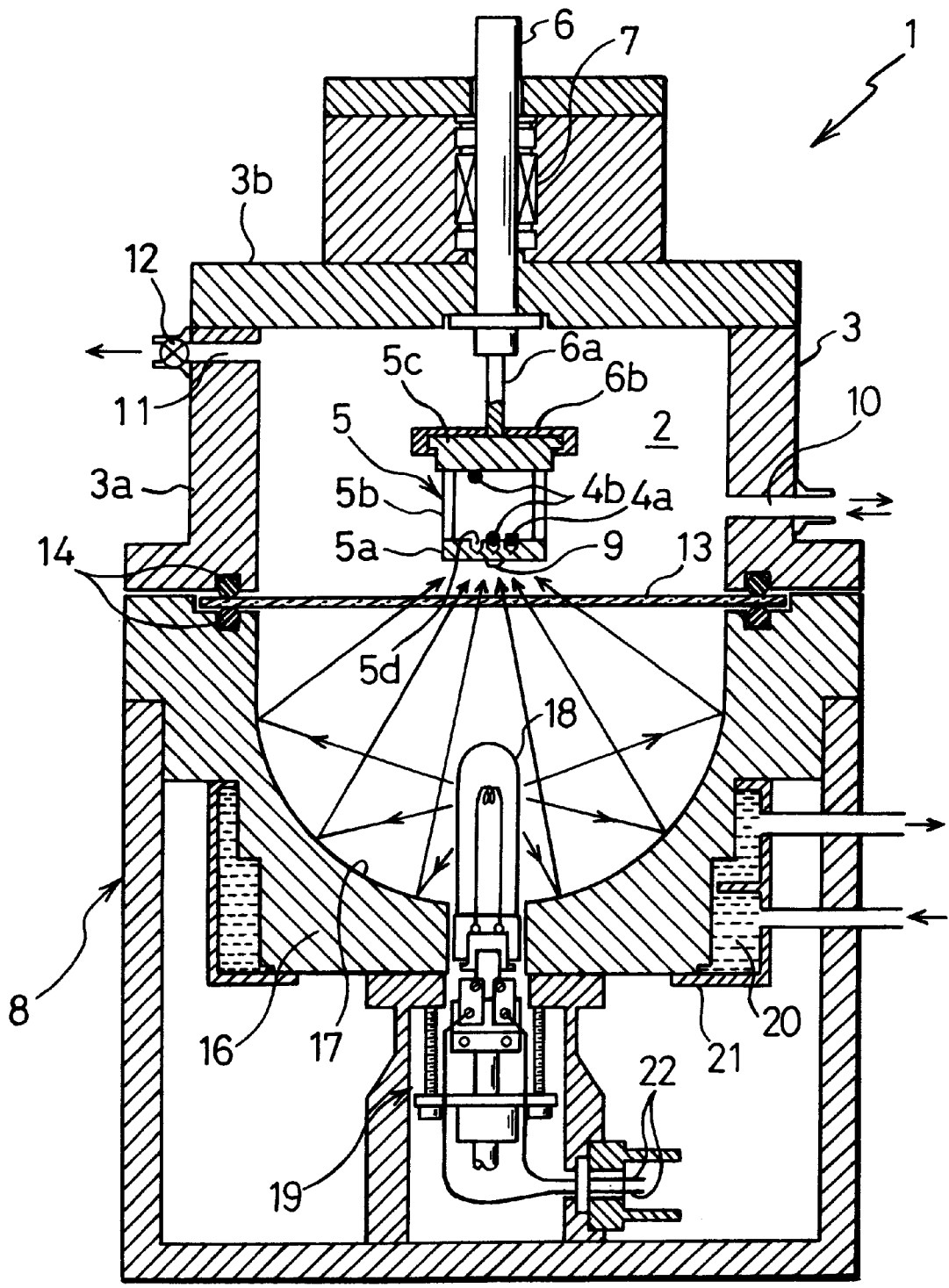
FIG. 1 is a longitudinal cross-section of the monocrystal manufacturing device of Embodiment 1.

Embodiment 1 (Refer to FIG. 1)

The monocrystal manufacturing device of the present embodiment is a monocrystal manufacturing device suitable for using with means for achieving microgravitational conditions. The monocrystal manufacturing device, aided by the microgravitational conditions achieved by the microgravity achieving means, manufactures monocrystals from raw materials.

The microgravity achievement means include: formats which achieve microgravitational conditions by dropping objects, such as drop tubes, drop towers, airplanes and small rockets, and formats which achieve microgravitational conditions by balancing the force of gravity with centripetal force in an orbit, such as space shuttles, free flyers, recovery capsules and space stations, or the like.

Referring to FIG. 1, among the various microgravity achieving means, this monocrystal manufacture device is suitable for use with a microgravity achievement means which has comparatively few restrictions in terms of usage space or usage time. This monocrystal manufacture device will be described first.

Referring to FIG. 1, there is a monocrystal device 1, comprising: a stainless steel chamber case 3, which is air tight and forms a chamber 2 which has a circular cross-section; a graphite raw material container 5, which is placed inside chamber 2 and stores raw material 4a; a stainless steel support rod 6, which supports raw material container 5 onto chamber case 3; a solenoid actuator 7, which, via support rod 6, drives an up and down motion of raw material container 5 relative to chamber case 3; a gold image furnace 8 as the heating means for heating raw material 4a inside raw material container 5.

Raw material container 5 comprises: a tray 5a at the lower end for placing raw material 4a; a plurality of support poles 5b; a ceiling 5c. Small rod 6a on the bottom of support rod 6 is fixed to a stainless steel holder 6b which is connected to ceiling 5c of material container 5. The 9 particulate raw materials 4a are placed on a plurality of concave areas 5d (there are 9 with a diameter 2.2 mm, depth 1.5 mm, and a length and breadth pitch of 3 mm) formed on tray 5a. A thermocouple 9 is attached to the bottom surface of tray 5a for temperature measurement. Its lead wire (not shown) extends along support pole 5b of material container 5, passes through a wire pathway inside support rod 6, extends to the outside, and is connected to a control unit (not shown). Solenoid actuator 7 is constructed so that, by a solenoid coil, it can drive the up and down motion of support rod 6 at a specified stroke (for example, approximately 2 mm). Solenoid actuator 7 is controlled by the control unit.

Chamber case 3 comprises a cylindrical tube 3a and a top plate 3b which closes the top end. On the side of tube 3a, an opening window (not shown) which observes raw material 4a is formed. In order to make the inside of chamber 2 an inert gas (for example argon gas or the like) environment, tube 3a is provided with the following: a port 10 for exhausting air by a vacuum pump and for supplying inert gas, an exhaust port 11 for allowing inert gas to flow inside chamber 2, and an closing valve 12 which can open and close discharge port 11. At least during the time when raw material 4a is being melted and solidified, the flow of inert gas is stopped, and air tight conditions can be maintained.

A transparent quartz plate 13, which has excellent light transparency, creates a partition between chamber 2 and gold image furnace 8. There are O rings 14 around the perimeter on both sides of quartz 13. Gold image furnace 8 comprises: a furnace body 16 of an aluminum/magnesium alloy; a gold-plated, ellipsoidal, reflective surface 17 which is formed on the inner surface of furnace body 16; a halogen lamp 18 (maximum power consumption of 1 kW), which has its light emitting part positioned on the focal point of ellipsoidal reflective surface 17; a fine adjustment mechanism for fine adjustments to the position of halogen lamp 18; a pathway formation 21, which forms a cooling water pathway 20.

When electrical current is supplied from lamp terminal 22 of halogen lamp 18, infrared light, which radiates from the light-emitting part of halogen lamp 18, is reflected off of ellipsoidal reflective surface 17, passes through quartz plate 13, and converges onto the other focal point of ellipsoidal reflective surface 17. Because tray 5a of raw material container 5 is positioned on the other focal point, raw material 4a inside raw material container 5 can be melted at the specified temperature.

Furthermore, in monocrystal manufacturing device 1, raw material container 5 and support rod 6 and solenoid actuator 7 correspond to the crystal nucleus generating means. However, an up/down driving actuator other than solenoid actuator 7 can also be used.

Monocrystal manufacturing device 1 is placed inside a drop capsule which is used for a drop shaft at the Underground Zero gravity Experimental Center (located in Hokkaido of Japan). Under microgravitational conditions (maintained for 10 seconds) of $10^{-4}$ G or lower which is achieved when the drop capsule is falling at the gravitational acceleration, the crystal growth experiment was executed as follows. It was possible to directly grow a granular monocrystal from a spherical melt of semiconductor raw material without using a seed crystal.

First, each of a total of 9 particles of raw material 4a, which were cubic Ge crystals with a purity of 9N and with a side of 1.47 mm, was housed on each of the 9 concave areas 5d. Next, air was exhausted from inside chamber 2 to create a vacuum, and afterwards, as argon gas was flowing inside chamber 2, raw material 4a was heated and melted by halogen lamp 18. For the temperature setting of gold image furnace 8, the temperature at which there is complete melting under a gravity of 1G was confirmed by eye in advance, and the temperature was set for 2–3 degrees C. higher than this temperature.

Next, after raw material 4a was melted, closing valve 12 was closed, and the inside of chamber 2 was made into a still environment of argon gas. After maintaining the melting temperature for around 15 seconds, the fall of the drop capsule was initiated. After 1–3 seconds after the initiation of the fall, the power to halogen lamp 18 was shut off, and at the same time, solenoid actuator 7 was operated so that raw material container 5 was moved approximately 0.2 mm downward (in the direction of the fall of the drop capsule) at a speed of 20 mm/sec. As a result, from concave area 5d of tray 5a, melt 4b floated upwards relative to raw material container 5, becoming a spherical melt. While cooling naturally, it entered a supercooled state. Due to inertial motion, within a few seconds, spherical melt 4b collided with the solid surface of ceiling 5c or support pole 5b of raw material 5. By the contact with the solid surface, the surface free energy on a portion of the surface of supercooled spherical melt 4b was lowered, and a crystal nucleus was generated at a portion of spherical melt 4b. The behavior of melt 4b was recorded in real time with a video camera. Afterwards, during the fall of the drop capsule, melt 4b continued to radiate heat, and a crystal continued to grow and solidify from the crystal nucleus of spherical melt 4b, and this resulted in a granular monocrystal. After the 10 seconds of microgravity environment time (the time during which the drop capsule is falling at the gravitational acceleration), the drop capsule received a braking force by a brake and was received and stopped at the bottom of the drop tower. Afterwards, monocrystal manufacturing device 1 was removed from the drop capsule, and the monocrystal was removed from monocrystal manufacturing device 1.

Some of the monocrystals had returned to the bottom of tray 5a after contacting with a solid surface, and others remained adhered to the solid surface. On all of the monocrystals, there was evidence that they had contacted a solid surface. The monocrystals in which the collision with the solid surface was gentle had a nearly spherical shape. The monocrystals which had a more severe collision with the solid surface had a projectile shape. However, in all of the monocrystals, when the crystal properties were examined with X ray analysis, a periodic Laue spot was observed, and they were confirmed as being monocrystals.

Referring to FIG. 1, the changes with time of a typical raw material 4a is shown. The unmelted raw material 4a is indicated on the right edge of tray 5a, and to the left of this, melt 4b, before it enters microgravitational conditions, is shown. As indicated underneath the ceiling surface, spherical melt 4b, after it enters microgravitational conditions, levitates, and, due to inertial motion, contacts ceiling 5c of raw material container 5.

Other than the raw material of germanium (Ge), the same experiment was conducted using the raw materials of gallium antimonide (GaSb) and indium antimonide (InSb). For both of these, the raw materials which were used had sizes which were cut to 0.4 mm³. 1–4 particles were stored in each of concave areas 5d. These were melted, and melts were made for each. The heating melting temperatures were set according to the raw material. The time until the raw material 5 was lowered was in the range of 1–5 seconds after the initiation of the fall. The levitating time until the spherical melt contacted a surface was within 2, 3 seconds. After the fall of the drop capsule was completed, the monocrystals were collected and examined by X-ray analysis. They were confirmed to have been monocrystallized.

In the manufacturing technology for the monocrystal which is described above, monocrystal manufacturing device 1 is used in a microgravity achieving means. Monocrystal manufacturing device 1 solidifies spherical melt 4b, which has been supercooled under microgravitational conditions, into a monocrystal.

With this monocrystal manufacture technology, various advantages are achieved. There are few space and time restrictions needed in order to utilize the microgravitational conditions achieved by the microgravity achieving means, and various conditions for crystal growth can be specified. The technology is suitable for manufacturing monocrystals in the microgravitational environment of space. A granular monocrystal can be manufactured from the melt of a raw material without a using seed crystal. Monocrystals of various materials (single element semiconductors compound semiconductors, metal material, insulating material, or the like) can be manufactured. A monocrystal can be manufactured with a small device.

Figure 2:
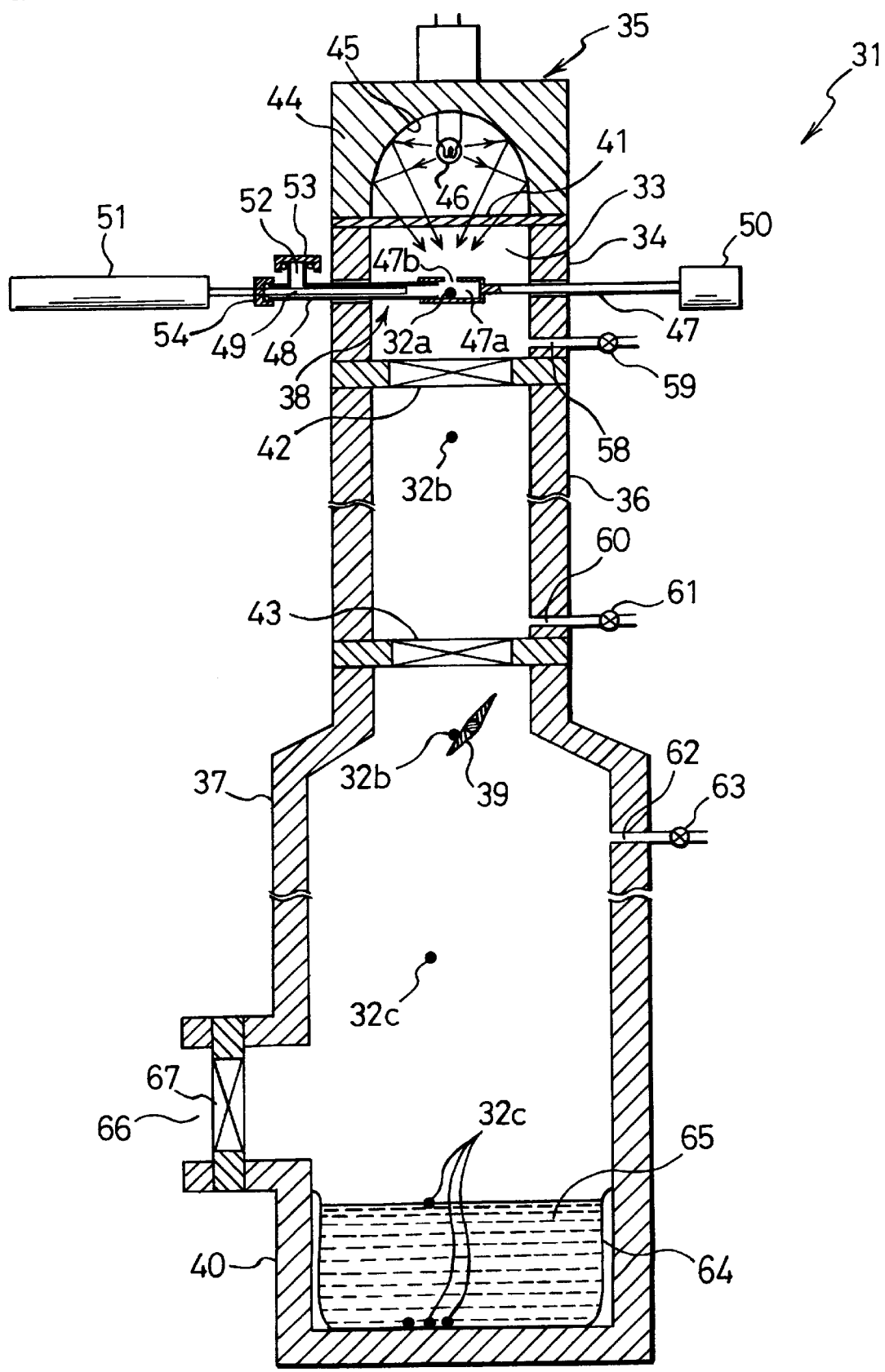
FIG. 2 is a longitudinal cross-section of the monocrystal manufacturing device of Embodiment 2.

Embodiment 2 (Refer to FIG. 2)

The monocrystal manufacturing device of this embodiment is a device for manufacturing monocrystals utilizing microgravitational conditions created by free fall on the terrestrial surface. The method of manufacturing monocrystals with this device is relatively easily implemented.

First, referring to FIG. 2, this monocrystal manufacture device will be described.

Referring to FIG. 2, monocrystal manufacture device 31 comprises: a chamber case 34, which forms a chamber 33; chamber 33, which houses raw material 32a and creates a vacuum atmosphere; a gold image furnace 35, which is placed as a heating means above chamber 33; an upper drop tube 36, which is connected to the lower end of chamber case 34 and extends vertically to a specified length (for example 4 m); upper drop tube 36 allows for a perpendicular free fall of the spherical melt 32b which is the melted raw material 36a; a lower drop tube 37, which extends downward from the bottom of upper drop tube 36 and which has the drop length (for example 10 m) needed for the time required to solidify melt 32b; a raw material supply/retention mechanism 38 which supplies raw material 32a to the inside of chamber 33 and retains raw material 32a so that it can be either retained or released; a graphite rotating piece 39, which is installed near the top of lower drop tube 37 and which contacts melt 32b for a short period of time during its fall; a recovery vat 40, which is connected to the bottom of lower drop tube 37 and which is equipped with a liquid vat which absorbs the impact of the crystallized monocrystal and cools it.

Referring to the Figure, a transparent quartz plate 41 creates a partition between chamber case 34 and gold image furnace 35. An air lock 42 creates a partition between chamber case 34 and upper drop tube 36. An air lock 43 creates a partition between upper drop tube 36 and lower drop tube 37. When air lock 42 is opened, chamber 33 and the inside of upper drop tube 36 are in communication. When air lock 43 is opened, the inside of upper drop tube 36 and the inside of lower drop tube 37 are in communication. Gold image furnace 35 has the same construction as in Embodiment 1. An ellipsoidal reflective surface 45 is formed on the bottom surface of a furnace body 44. A halogen lamp 46 is installed at the focal point of ellipsoidal reflective surface 45. The infrared rays radiated from halogen lamp 46 converge onto the other focal point inside chamber 33. Raw material 32a, which is retained by raw material supply/retention mechanism 38, is placed at this lower focal point.

Raw material supply/retention mechanism 38 comprises: a quartz rotating pole 47; a holding compartment 47a, which is formed on the left end of rotating pole 47 and retains raw material 32a; a quartz sleeve 48; a quartz raw material inserting pole 49; a pivoting actuator 50, which pivots rotating pole 47 180 degrees; a reciprocating actuator 51, which drives a reciprocating motion of raw material inserting pole 49; a raw material input opening 52, which is formed on sleeve 48; and the like. Rotating pole 47 is introduced into chamber 33 by passing through the right wall of chamber case 34. On the left end of rotating pole 47, a holding tube, which has a circular cross section and is open on the left end, is formed. Inside the holding tube, a holding compartment 47a, which retains raw material 32a, is formed. An opening 47b, which is for dropping melt 32b, is formed on the top end of the holding tube.

Sleeve 48 is introduced into chamber 33 by passing through the left wall of chamber case 34. The right end of sleeve 48 is fitted into the holding tube and can rotate freely. Raw material insertion pole 49 is inserted from the left end of sleeve 48 into sleeve 48. Raw material 32a, which is supplied to the inside of sleeve 48 from raw material input opening 52, is pushed into holding compartment 47a by raw material inserting pole 49. Raw material input opening 52 can be sealed by a cap 53 and an O ring. The left end of sleeve 48 can be sealed air tight by a box nut 54 and an O ring.

In order to change the interior of chamber 33 into a vacuum or an inert gas environment, chamber case 34 is equipped with an exhaust port 58 and a closing valve 59 which can open or close exhaust port 58. A vacuum pump and an inert gas supply device are connected to exhaust port 58 in a switchable format. Similarly, in order to change the interior of upper drop tube 36 into a vacuum or an inert gas environment, upper drop tube 36 is equipped with an exhaust port 60 and a closing valve 61 which can open or close exhaust port 60. A vacuum pump and an inert gas supply device are connected to exhaust port 60 in a switchable format. Similarly, in order to change the interior of lower drop tube 37 and recovery vat 40 into a vacuum or an inert gas environment, lower drop tube 37 is equipped with an exhaust port 62 and a valve 63 which can open or close exhaust port 62. A vacuum pump and an inert gas supply device are connected to exhaust port 62 in a switchable format. Rotating plate 39 is installed so that it can contact spherical melt 32b while spherical melt 32b is free falling. Furthermore, there is a mechanism (not shown) which can adjust the angle at which rotating plate 39 collides with spherical melt 32b and the rotation speed of rotating plate 39.

In order to soften the impact of falling monocrystal 32c and in order to cool monocrystal 32c, a silicone cooling liquid 65 is stored in liquid container 64 at the bottom of recovery vat 40. An opening window 66 for removing monocrystal 32c and an air lock 67, which can open or close opening window 66, are located on the side wall of recovery vat 40. Furthermore, there is a control unit (not shown) which drives and controls halogen lamp 46, pivoting actuator 50, reciprocating actuator 51, closing valve 59, closing valve 61, closing valve 63, air lock 42, air lock 43, air lock 67, vacuum pumps, inert gas supply devices, and the like. Furthermore, in monocrystal manufacture device 31, rotating plate 39 corresponds to the means for generating the crystal nucleus.

Next, the method by which a granular monocrystal is manufactured from semiconductor raw material using monocrystal manufacturing device 31 will be explained.

This monocrystal manufacturing method is characterized by the following: raw material 32a, comprising semiconductor material, is melted and allowed to free fall; under the microgravitational conditions during the fall, the supercooled spherical melt 32b is contacted with a solid surface, and a crystal nucleus is generated; afterwards, while there is further free falling, melt 32b is solidified and crystallized into monocrystal 32c.

First, after closing air lock 42 at the bottom of chamber 33, raw material 32a, which has had its shape and volume determined in advance, is put inside sleeve 48 through raw material input opening 52. Raw material 32a is pushed into holding compartment 47a by raw material inserting pole 49. Cap 53 and box nut 54 are closed and made air tight, and the air inside chamber 33 is released to create a vacuum. Similarly, air is released from the inside of upper drop tube 36 and lower drop tube 37 and recovery vat 40 to create a vacuum. When raw material 32a is dropped, air lock 42 and air lock 43 are opened so that spherical melt 32b can fall in a vacuum.

Raw material 32a is heated by halogen lamp 46 to a temperature which has been determined in advance, and raw material 32a in holding compartment 47a is melted. Melt 32b becomes a hemispherical melt due to surface tension, but the melt is held at a constant temperature for a set period of time. Afterwards, rotating pole 47 is pivoted 180 degrees, and opening window 47b is directed downwards to allow melt 32b to free fall.

Due to surface tension, melt 32b becomes spherical melt 32b. While it free falls inside upper drop tube 36, melt 32b rapidly releases heat under microgravitational conditions. The temperature is lowered, and melt 32b becomes supercooled.

Supercooled melt 32b comes into contact with the solid surface of rotating plate 39 for a very short time. As a result, a crystal nucleus is (generated in a portion of the surface of melt 32b. Afterwards, the direction of fall of melt 32b is deflected, and free fall is continued. While microgravitational conditions are maintained, it solidifies rapidly in a spherical shape, and the monocrystal grows to become spherical monocrystal 32c. This drops into silicone cooling liquid 65 in liquid container 64 at the bottom of recovery vat 40. Monocrystal 32c is rapidly cooled and stops at the bottom of liquid container 64.

By this monocrystal manufacturing method, the temperature of the melt before the fall is controlled by adjusting the output of halogen lamp 46. The temperature can be set to the optimal temperature depending on the material. The following parameters relate to the degree of supercooling: the temperature of melt 32b before the fall; the type and size of melt 32b; the time or the dropping distance before contact with rotating plate 39; and the like. As a result, these parameters must be reflected in the design of the device. Furthermore, in order to achieve optimal results, it is preferable to control the following: the angle at which rotating plate 39 contacts spherical melt 32b; the contact pressure; contact time; and the like. Although the contact surface of rotating plate 39 needs to be of a material which is chemically stable, it is preferable that the material for the contact surface be selected according to the type of melt. It is preferable to set the falling distance of the device such that, after contacting rotating plate 39, melt 32*b* can complete its solidification by the time it reaches cooling liquid 65.

This monocrystal manufacture method is preferably used for raw materials which have a low vapor pressure and which are of a material which does not readily thermally decompose in a vacuum. Silicon, germanium, mixed crystal of silicon germanium, or indium antimonide, gallium antimonide, mixed crystals of these, and the like can be used. However, it goes without saying that monocrystals can also be manufactured using metal materials and insulating materials.

By this monocrystal manufacturing technology, the following advantages are achieved: spherical monocrystals can be crystallized directly from the melt of raw materials without using seed crystals; a spherical monocrystal of high quality with few crystal defects can be manufactured; unevenness in the composition or doping impurities due to the differences in densities of substances within the melt is reduced; monocrystals can be manufactured from various materials (single element semiconductors, compound semiconductors, metal materials, insulating materials, and the like); monocrystals can be manufactured with a device which is installed on the ground; the construction of the crystal nucleus generating means is simplified; and because raw material can be continuously supplied by raw material supply/retention mechanism 38, the mass production of monocrystals become possible.

Embodiment 3 (Refer to FIGS. 3–6)

For compound semiconductor crystals which have component elements with a high dissociation pressure, in order to prevent the dissociation of elements from melts or from solidified crystals, crystal growth is often conducted inside an ampule or a capsule, and the Bridgeman method is used.

However, with the prior art, it is impossible to directly crystallize a monocrystal from a melt without using a seed crystal. In the monocrystal manufacturing technology of the present embodiment, a melt of a compound semiconductor crystal is synthesized, and a monocrystal is directly crystallized from this melt without using a seed crystal.

Figure 3:
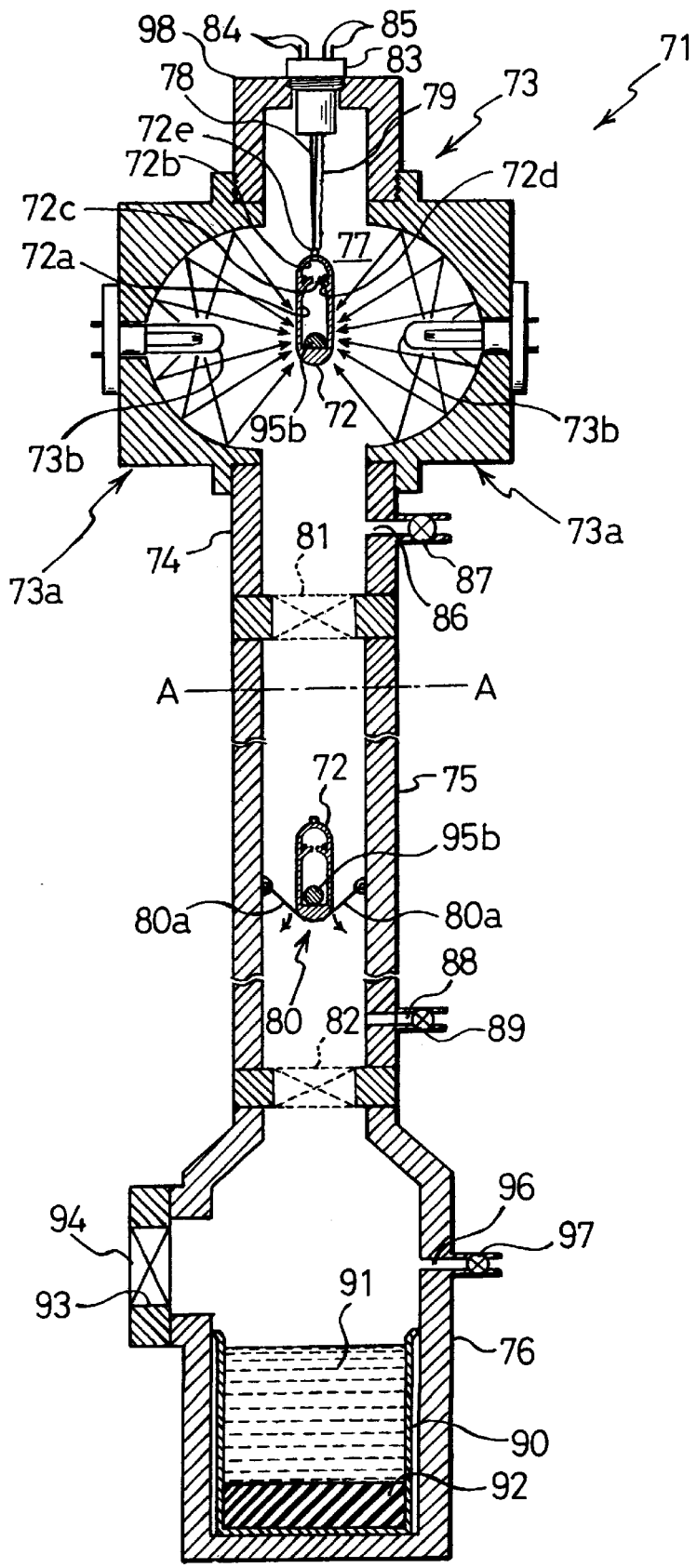
FIG. 3 is a longitudinal cross-section of the monocrystal manufacturing device of Embodiment 3.
Figure 4:
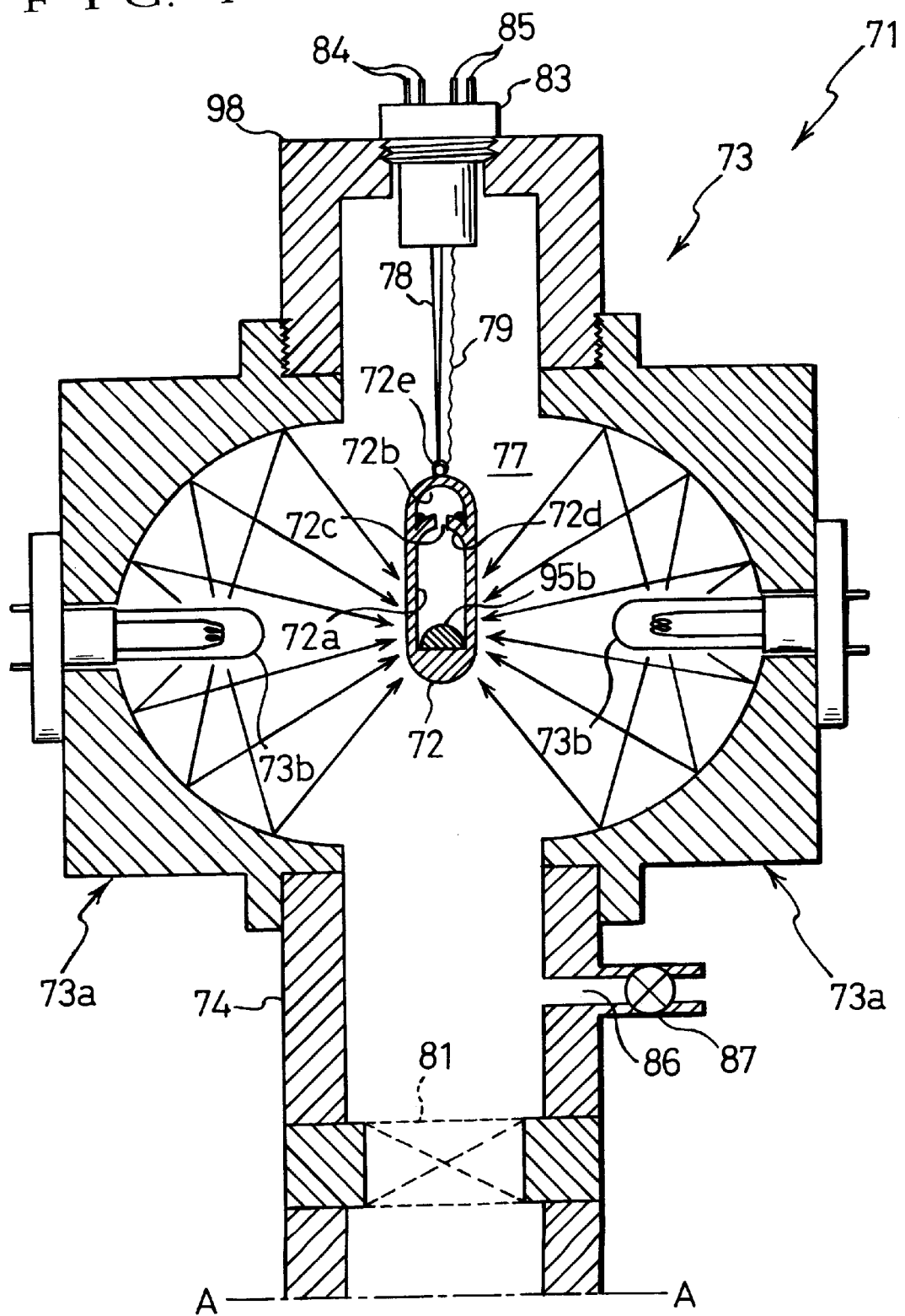
FIG. 4 is the longitudinal cross-section of the top portion of the monocrystal manufacturing device of FIG. 3.
Figure 5:
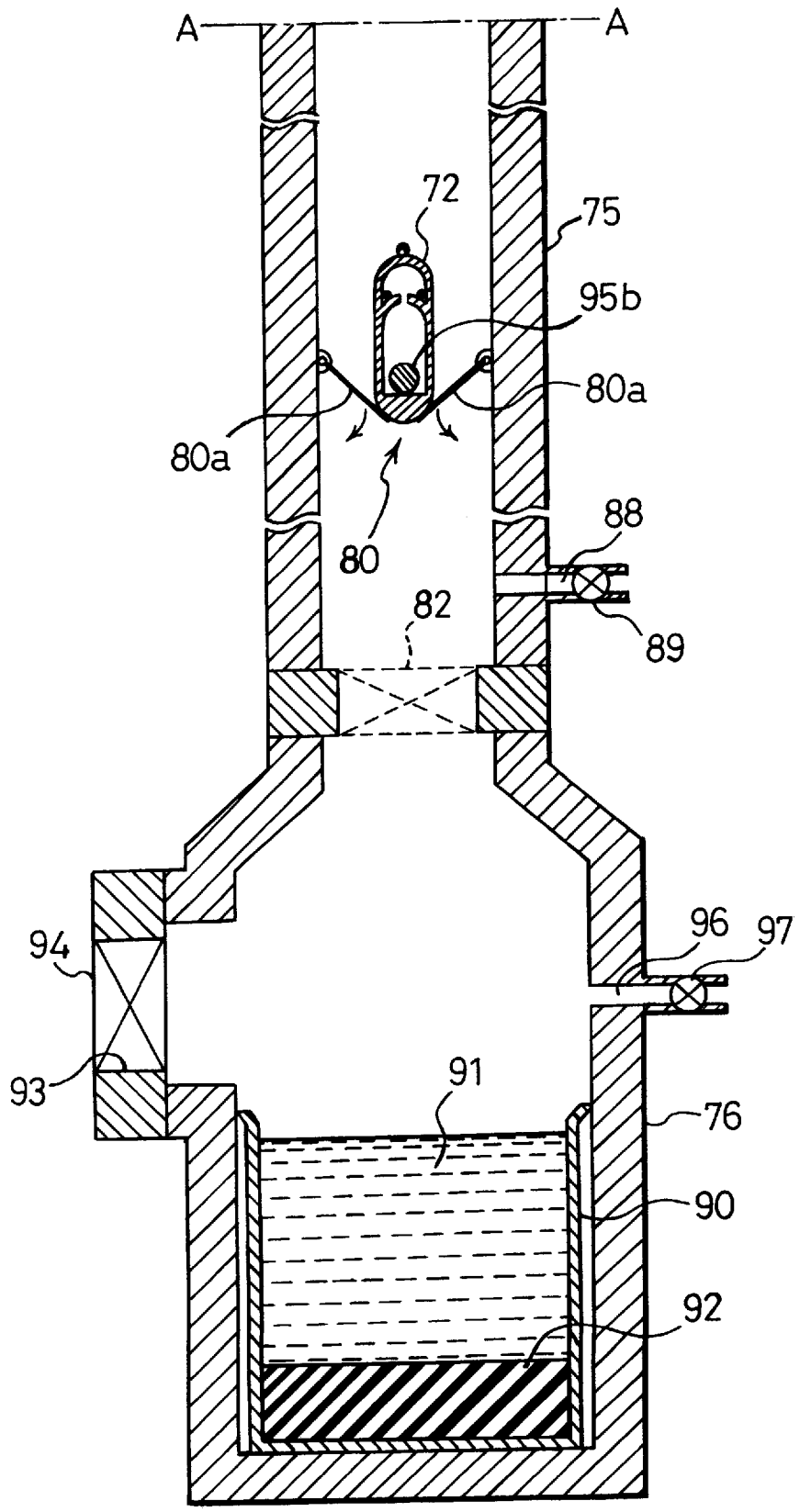
FIG. 5 is the longitudinal cross-section of the rest of the monocrystal manufacturing device of FIG. 3.

First, the monocrystal manufacturing device is explained. Referring to FIG. 3, the entirety of a monocrystal manufacturing device 71 is shown. Referring to FIG. 4, the top portion of monocrystal manufacturing device 71 is shown. Referring to FIG. 5, the remaining portion of monocrystal manufacturing device 71 is shown. Referring to FIGS. 3–5, monocrystal manufacturing device 71 comprises: a quartz ampule 72 (this corresponds to the capsule), which vacuum seals the raw material; a double ellipsoidal gold image furnace 73; a short furnace tube 74, which connects to the underside of gold image furnace 73; a drop tube 75, which connects to the bottom of furnace tube 74 and extends vertically to a specified length (for example, approximately 14 m); a recovery vat 76, which connects with the bottom of drop tube 75; a hanging copper wire 78 (corresponds to the means for holding the capsule), which holds ampule 72 inside chamber 77 of gold image furnace 73; a thermocouple 79 for detecting temperature; a deceleration mechanism 80, which is installed somewhere in the middle of the vertical direction of drop tube 75; a control unit (not shown); and the like. An air lock 81 creates a partition between furnace tube 74 and drop tube 75, and an air lock 82 creates a partition between drop tube 75 and recovery vat 76.

In double ellipsoidal gold image furnace 73, a pair of ellipsoidal gold image furnaces 73*a*, 73*a* are opposite each other in the horizontal direction. They have a single common focal point. Referring to the figure, ampule 72 is held by hanging copper wire 78 so that the raw material housed in ampule 72 is positioned at the common focal point. The raw material can be heated and melted. A hermetically sealed terminal 83 is installed at the top of gold image furnace 73. Hanging copper wire 78 extends from hermetically sealed terminal 83. A Pt-PtRh thermocouple 79, which also extends from hermetically sealed terminal 83, is connected so that it can detect the temperature in auxiliary compartment 72*b* of ampule 72. On hermetically sealed terminal 83, there are an external terminal 84, which is connected to hanging copper wire 78, and an external terminal 85, which connects to thermocouple 79.

On furnace tube 74 which is in communication with gold image furnace 73, a port 86 and a closing valve 87, which can open and close port 86, are installed. Port 86 is connected to a vacuum pump and is constructed so that the air inside chamber 77 can be evacuated. Air can also be introduced into the interior as needed. A transparent air-tight window (not shown) for observing the raw materials or the melt inside ampule 72 is formed on a terminal attachment member 98 which attaches hermetically sealed terminal 83. Referring to FIGS. 3 and 4, a port 88 and a closing valve 89 which can open and close port 88 are installed on the side wall of drop tube 75. Port 88 is connected to a vacuum pump and is constructed so that air can be evacuated from drop tube 75. Port 88 can also introduce air into the interior as required. Decelerating mechanism 80 is for decelerating ampule 72 which is falling inside drop tube 75. It is constructed somewhere along the height direction of the interior of drop tube 75. Decelerating mechanism 80 has a pair of right and left rotating plates 80*a* which are impelled in the opposite direction as the arrows by a weak spring. The upper end of each rotating plate 80*a* is joined to the side walls by a hinge. When falling ampule 72 comes into contact with the pair of rotating plates 80*a*, it is decelerated and, without stopping, continues to fall.

Silicone oil 91, which acts to soften the impact of ampule 72 and to cool ampule 72, and a cushion 92 of a silicone rubber or the like, which is for impact absorption, are housed in liquid container 90 at the bottom of recovery vat 76. On the side wall of recovery vat 76, there is an opening window 93 for removing ampule 72. Opening window 93 is constructed so that it can be opened or closed by an air lock 94.

On the side wall of recovery vat 76, a port 96 and a closing valve 97 which can open and close port 96 are installed. Port 96 is connected to a vacuum pump and is constructed so that air can be evacuated from the inside of recovery vat 76. Air can also be introduced into the interior as required.

Referring to FIG. 4, quartz ampule 72 comprises: a main compartment 72*a*, which forms a monocrystal from melt 95*b* of a raw material; an auxiliary compartment 72*b*, which is positioned above main compartment 72*a* and where an element with a high vapor pressure is evaporated and is dissolved into melt 95*b* inside main compartment 72*a*; a dispersion barrier 72*d*, which is installed between main compartment 72*a* and auxiliary compartment 72*b* and in which a small hole 72*c* for regulating vapor diffusion is formed. When manufacturing a monocrystal of a compound semiconductor which contains an element with a high dissociation pressure, the raw materials are sealed in ampule 72 and dropped.

In this case, raw material, in which each of the component elements have been measured in advance to achieve the stoichiometric composition of the compound semiconductor at its melting point, can be housed inside main compartment 72a. Or alternatively, raw material, which is a polycrystal which has the composition of the compound semiconductor, can be housed in main compartment 72a. This raw material is heated and melted by gold image furnace 73, and a melt of the compound semiconductor is created.

The raw material of an element with a high dissociation pressure is stored in auxiliary compartment 72b. Heating temperature is provided so that, at the melting point of the element, enough vapor pressure equivalent to dissociation pressure is generated in order for the melt in main compartment 72a to achieve the stoichiometric composition. Ampule 72 and deceleration mechanism 80 correspond to the crystal nucleus generating means.

Next, using monocrystal manufacture device 71, an example of the manufacture of a monocrystal of In0.97Ga0.03As semiconductor is explained. Ga and In, which are component elements of In0.97Ga0.03As semiconductor, was placed at the bottom of main compartment 72a of ampule 72. The amount which is placed inside corresponds to the amount of gallium (Ga) and indium (In) in the melt composition at the melting point of $In_{0.97}Ga_{0.03}As$. Similarly, an amount of As which is necessary to generate the arsenic (As) pressure to balance the dissociation pressure of arsenic at the melting point of $In_{0.97}Ga_{0.03}As$ is placed in auxiliary compartment 72b. After storing the raw materials of these component elements, the air inside ampule 72 is evacuated to create a vacuum, and ampule 72 is then sealed.

Ampule 72 is hung by passing hanging copper wire 78 through a ring 72e at the top of ampule 72. Ampule 72 is positioned at the common focal point of gold image furnace 73. After the air inside chamber 77 is evacuated to create a vacuum, current is run to halogen lamp 73b. The bottom of main compartment 72a of ampule 72 is heated to 1070 degrees C., which is slightly higher than the melting point of $In_{0.97}Ga_{0.03}As$, and auxiliary compartment 72b is heated to approximately 600 degrees C. By the heating, initially, a melt comprising In and Ga is formed at the bottom of main compartment 72a. In auxiliary compartment 72b, a portion of As is sublimated, and it diffuses as a gas inside main compartment 72a and reacts with the melt of In and Ga. A melt with a composition of $In_{0.97}Ga_{0.03}As$ is synthesized. In order to allow free fall of ampule 72 in drop tube 75 and in recovery vat 76, which have had their air evacuated to a vacuum in advance, air locks 81, 82 are opened before melt 95b is completely synthesized,. Next, once the synthesis of melt 95b of $In_{0.97}Ga_{0.03}As$ has been completed, current is run through hanging copper wire 78, and wire 78 is melted. Ampule 72 free falls, and at the same time, the power to halogen lamp 73b is turned off.

Ampule 72 free falls through a vacuum, and during the fall, it contacts a pair of rotating plates 80a and is decelerated. Afterwards, its free fall is continued, and ampule 72 plunges into silicone oil 91 of recovery vat 76. Finally, it collides with cushion 92 of silicon rubber and is stopped.

After initiation of the drop, the inside of ampule 72 changes into a microgravitational environment. Melt 95b of $In_{0.97}Ga_{0.03}As$ is levitated and becomes spherical due to the action of surface tension. Spherical melt 95b releases heat during the fall and becomes supercooled. Ampule 72 is then contacted with the pair of rotating plates 80a, and the falling speed is reduced. Gravity operates inside ampule 72. Melt 95b, which had been levitated, comes into contact with the solid surface of the bottom surface of main compartment 72a for a short period of time. As a result, a crystal nucleus is generated in a portion of the surface of spherical melt 95b. Afterwards, because ampule 72 continues its free fall and releases heat, crystal growth rapidly proceeds from the crystal nucleus of melt 95b, which is levitating inside main compartment 72a. The entire spherical melt 95b becomes a monocrystal 95c of $In_{0.97}Ga_{0.03}As$. Next, it plunges into silicone oil 91 and is cooled.

Figure 6:
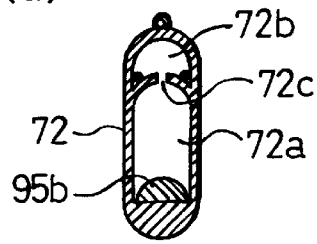
FIG. 6(a)–(e) is an explanatory figure explaining, in 5 stages, the state and behavior of the raw material inside the ampule when a monocrystal is manufactured by the monocrystal manufacturing device of FIG. 3.
Figure 6:
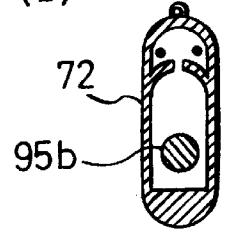
Figure 6:
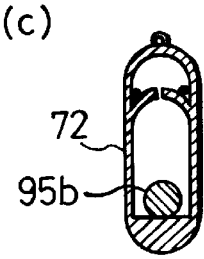
Figure 6:
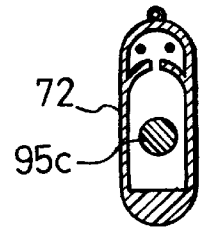
Figure 6:
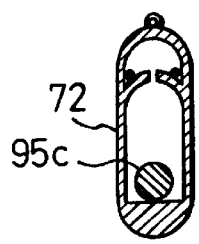

Referring to FIG. 6, additional explanation of the behavior starting from melt synthesis to solidification will be given.

Referring to FIG. 6(a), there is shown the conditions of ampule 72 immediately prior to initiation of dropping from gold image furnace 73. Ampule 72 is heated by gold image furnace 73, and the raw material of each of the component elements melts together to form a synthesized melt 95b of $In_{0.97}Ga_{0.03}As$.

Referring to FIG. 6(b), ampule 72 free falls inside drop tube 75, and microgravitational conditions are generated in its interior. Melt 95b is levitated and becomes spherical due to the action of surface tension. It is hypothesized that many of the atoms of the component elements in spherical melt 95b have a regular alignment similar to that found in monocrystals.

Referring to FIG. 6(c), there is shown the conditions when ampule 72 comes into contact with the pair of rotating plates 80a of decelerating mechanism 80 and decelerates. Spherical melt 95b collides with the bottom surface (solid surface) of main compartment 72a, and a portion of the surface of spherical melt 95b contacts with the bottom surface. Because the free energy at this surface is lowered, a crystal nucleus is generated at this portion.

Referring to FIG. 6(d), ampule 72 passes by decelerating mechanism 80 and is in a free fall state once again. The levitated spherical melt 95b solidifies, and a spherical monocrystal 95c is shown.

Referring to FIG. 6(e), the state of ampule 72 plunging into silicone cooling liquid 91 is shown. This monocrystal manufacturing method can be used to manufacture monocrystals of compound semiconductor crystals which contain elements with a high dissociation pressure other than the one described. However, it should also be clear that this method can be used for manufacturing spherical monocrystals using raw materials of metal materials or insulating materials.

By this monocrystal manufacturing technology, the following advantages are achieved: spherical monocrystals can be directly manufactured from melts without using seed crystals; compound semiconductors can be synthesized from various types of elements; because monocrystallization occurs while being levitated in a spherical shape under microgravitational conditions, a high quality monocrystal with extremely few crystal defects can be manufactured; unevenness in the composition or doping impurities due to the differences in densities of substances within the melt is reduced; monocrystals of compound semiconductors of 3 or more elements can be manufactured; spherical monocrystals of various materials (single element semiconductors, compound semiconductors, metal materials, insulating materials, and the like) can be manufactured; and the like.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

For example, modes with partial changes, such as the following, can be implemented for Embodiments 1–3.

1) Instead of a halogen lamp, heating means such as a resistance heating device, high frequency electromagnetic induction heating device, electron beam heating device, laser heating device, and the like can be used.

2) When manufacturing a monocrystal by dropping an ampule as in Embodiment 3, it is preferable to separately heat the main compartment, where melt of a high temperature is made, and a lower temperatured auxiliary compartment, where volatile elements are evaporated. As a result, it is preferable for the main compartment and auxiliary compartment to each have their own temperature-controlled heating source. This is possible with the existing art.

3) It is known that spherical melts or spherical melts which are levitated under microgravitational conditions have a much faster crystal growth rate compared with when they are under gravity. According to hypotheses by the inventors relating to this, the configuration of a supercooled melt differs from that of a melt under gravity. Because the supercooled melt has a regular atomic alignment similar to monocrystals, once a crystal nucleus is generated at a point or at a limited section, the crystal rapidly grows from the crystal nucleus to form a monocrystal because the chemical potential of the liquid phase is large. Therefore, instead of contacting one end of the spherical melt to a solid substance in order to generate a crystal nucleus as in the embodiments, one end or a limited section of the spherical melt can be irradiated with an ion beam during the fall, thereby reducing the surface free energy and generating a crystal nucleus. The monocrystal can be grown from this crystal nucleus.

What is claimed is:

1. A method of making a monocrystal comprising:

heating a raw material to at least its melting point to form a molten mass;

reducing a temperature of said molten mass, thereby forming a supercooled molten mass;

reducing surface energy of at least a portion of a surface of said supercooled molten mass, while levitating said supercooled molten mass under microgravitational conditions, thereby forming a crystal nucleus; and solidifying said supercooled molten mass having said crystal nucleus under microgravitational conditions to form a granular monocrystal.

2. A method of making a monocrystal according to claim 1, wherein said raw material is a single element semiconductor material.

3. A method of making a monocrystal according to claim 1, wherein:

said raw material is a compound semiconductor material; and said monocrystal is a monocrystal of a compound semiconductor.

4. A method of making a monocrystal according to claim 1, wherein:

said raw material is a semiconductor material having a plurality of elements; and said monocrystal is a monocrystal of a compound semiconductor.

5. A method of making a monocrystal according to claim 1, wherein:

said method is conducted with a semiconductor material having a high vapor pressure; and said semiconductor material having a high vapor pressure is housed in a capsule.

6. A method of making a monocrystal according to claim 5, wherein:

semiconductor materials other than said semiconductor material having a high vapor pressure are stored in advance in a main compartment of said capsule;

said semiconductor material having a high vapor pressure is stored in advance in an auxiliary compartment communicating with said main compartment; and said semiconductor materials in said main compartment and said semiconductor material in said auxiliary compartment are heated to different temperatures.

7. A method of making a monocrystal according to claim 1, wherein said method is conducted under an atmosphere selected from the group consisting of a vacuum atmosphere, an inert gas atmosphere, and an oxidizing gas atmosphere.

8. A method of making a monocrystal according to claim 1, wherein said surface free energy is lowered by contacting a portion of said surface of said supercooled molten mass with a highly chemically stable solid surface for a short period of time.

9. A method of making a monocrystal according to claim 1, wherein said surface free energy is lowered by irradiating an ion beam onto a portion of said surface of said supercooled molten mass for a short period of time.

10. A device for manufacturing a monocrystal from a raw material comprising:

a chamber case forming an air-tight chamber;

means for achieving microgravitational conditions in said chamber case;

a raw material container located in said air-tight chamber storing said raw material;

means for heating said raw material inside said raw material container;

an actuator supporting said raw material container in said chamber case; and said actuator moving said raw material container with respect to said chamber case.

11. A device for manufacturing a monocrystal according to claim 10, wherein:

said raw material inside said raw material container is heated and melted by said heating means to form a molten mass;

said molten mass is levitated under microgravitational conditions inside said raw material container without any contact;

said molten mass is cooled into a supercooled molten mass;

said actuator drives movement of said raw material container with respect to said chamber case while said supercooled molten mass is levitated under microgravitational conditions, while said supercooled molten mass lacks contact with any surfaces;

a portion of a surface of said supercooled molten mass contacts a solid surface of said raw material container, thereby forming a crystal nucleus in said supercooled molten mass; and said supercooled molten mass is solidified into a granular monocrystal.

12. A device for manufacturing a monocrystal according to claim 10, wherein said means for heating includes an ellipsoidal reflective surface and a halogen lamp located at a focal point of said ellipsoidal reflective surface.

13. A device for manufacturing a monocrystal from a raw material comprising:

an air-tight drop tube, extending vertically;

retaining means to hold said raw material at a top of said drop tube;

releasing means to release said raw material from said retaining means;

heating means for heating and melting said raw material retained by said retaining means to form a molten mass;

crystal nucleus generating means to generates a crystal nucleus in said molten mass while said molten mass is retained under said microgravitational conditions;

said crystal nucleus generating means lowering a free energy of a portion of a surface of said molten mass during free fall of said molten mass along said drop tube after said molten mass is supercooled while free falling inside said drop tube; and a recovery part;

said recovery part recovering said monocrystal formed from solidification of said molten mass using said crystal nucleus as a nucleus.

14. A device for manufacturing a monocrystal according to claim 13, further comprising a suctioning means to suction air from inside said drop tube, creating a vacuum inside said drop tube.

15. A device for manufacturing a monocrystal according to claim 13, wherein said heating means includes an ellipsoidal reflective surface and a halogen lamp located at a focal point of said ellipsoidal reflective surface.

16. A device for manufacturing a monocrystal according to claim 13, wherein:

said crystal nucleus generating means includes a rotating plate;

said rotating plate is a solid material which is highly chemically stable; and said rotating plate is located along a fall pathway of said molten mass inside said drop tube.

17. A device for manufacturing a monocrystal from a raw material comprising:

an air-tight drop tube extending vertically;

a capsule containing said raw material;

retaining means to hold said capsule at a top of said drop tube;

releasing means to release said capsule from said retaining means;

heating means to heat and melt said raw material into a molten mass inside said capsule while said capsule is held by said retaining means;

crystal nucleus generating means to generate a crystal nucleus in said molten mass;

said crystal nucleus generating means lowers a free energy of a portion of a surface of said molten mass during free fall of said molten mass inside said capsule along said drop tube after said molten mass inside said capsule is supercooled during its free fall inside said drop tube;

a recovery part;

said recovery part recovering said capsule and said monocrystal which, during free fall, solidified into a monocrystal using said crystal nucleus as a nucleus.

18. A device for manufacturing a monocrystal according to claim 17, further comprising:

suctioning means to suction air from inside said drop tube to create a vacuum inside said drop tube.

19. A device for manufacturing a monocrystal according to claim 17, wherein said heating means includes an ellipsoidal reflective surface and a halogen lamp located at a focal point of said ellipsoidal reflective surface.

20. A device for manufacturing a monocrystal according to claim 17, wherein:

said crystal nucleus generating means is located along a fall pathway of said capsule inside said drop tube; and said crystal nucleus generating means includes deceleration means, whereby a velocity of said capsule falling inside said drop tube is reduced.

* * * * *